United States Patent
Tokoro et al.

(10) Patent No.: US 7,138,019 B2
(45) Date of Patent: Nov. 21, 2006

(54) METHOD FOR PRODUCING MAGNETOSTRICTIVE ELEMENT AND SINTERING METHOD

(75) Inventors: Seigo Tokoro, Tokyo (JP); Shiro Tomizawa, Tokyo (JP); Teruo Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 159 days.

(21) Appl. No.: 10/900,017

(22) Filed: Jul. 26, 2004

(65) Prior Publication Data

US 2005/0061401 A1 Mar. 24, 2005

(30) Foreign Application Priority Data

Jul. 30, 2003 (JP) ............... 2003-203926

(51) Int. Cl.
*H01F 1/08* (2006.01)
*H01F 1/22* (2006.01)

(52) U.S. Cl. .................. 148/122; 148/104; 419/30; 419/31; 419/38

(58) Field of Classification Search .............. None
See application file for complete search history.

(56) References Cited

U.S. PATENT DOCUMENTS 5,143,560 A * 9/1992 Doser .................. 148/101
6,444,052 B1 * 9/2002 Honkura et al. .......... 148/122

FOREIGN PATENT DOCUMENTS

JP 2003-3203 1/2003

* cited by examiner

*Primary Examiner*—John P. Sheehan
(74) *Attorney, Agent, or Firm*—Hogan & Hartson LLP

(57) ABSTRACT

In the step of sintering a compact that is finally to be a magnetostrictive element, when the temperature in a furnace is elevated, the atmosphere in the furnace is evacuated by a vacuum pump to keep the pressure in the furnace at negative pressure in a temperature range that allows thermal decomposition of hydride present in the compact to release hydrogen gas to accelerate release of hydrogen from the compact.

13 Claims, 5 Drawing Sheets

METHOD FOR PRODUCING MAGNETOSTRICTIVE ELEMENT AND SINTERING METHOD

BACKGROUND OF THE INVENTION

1. Field of the Invention

The present invention relates to a method for producing a magnetostrictive element, and a method for sintering an object to be sintered containing a hydride.

2. Description of the Related Art

Magnetostrictive elements have been used for various devices, e.g., linear actuators, vibrators, pressure torque sensors, vibration sensors and gyro sensors.

When a magnetostrictive element is used for a linear actuator, vibrator or the like, a driving force is generated by changing a magnetic field applied to change the dimensions of the magnetostrictive element. When a magnetostrictive element is used for a pressure torque sensor, vibration sensor, gyro sensor or the like, on the other hand, it detects its permeability changing with dimensional changes of the magnetostrictive element caused by external pressure and thereby sensing is conducted.

These magnetostrictive elements are produced by compacting an alloy powder of given composition into a compact in a magnetic field and sintering it in an inert gas atmosphere (See, for example, Japanese Patent Laid-Open No. 2003-3203, Page 4).

During the sintering step, a compact to be sintered into a magnetostrictive element tends to be oxidized, and also discolored by radiation heat from the heater as the heat source for sintering. Therefore, a compact is contained in a closed container.

However, the conventional techniques involve the following problems.

When starting material of a compact to be sintered into a magnetostrictive element contains a hydride, the hydride is thermally decomposed to generate hydrogen during the sintering step and hydrogen is released from the compact. If hydrogen is generated while a compact to be a magnetostrictive element is contained in a closed container, hydrogen is filled in the closed container to increase vapor pressure, finally preventing hydrogen generated in the compact from being released from the compact. Moreover, in the compact, a solid-state reaction of its microstructure starts from the surface as the sintering step proceeds, which further retards release of hydrogen from the compact.

As a result, the magnetostrictive element thus produced has nests formed by the gasified hydrogen bubbles, which deteriorate strength and magnetic properties of the magnetostrictive element, and also reduce yield. This trend is more noted as a size of the compact increases.

SUMMARY OF THE INVENTION

The present invention is developed to solve these problems involved in the conventional techniques. It is an object of the present invention to provide a method for producing a magnetostrictive element and a sintering method which can prevent formation of the nests and thereby improve element yield.

In the conventional techniques, the furnace in which a compact is sintered is purged with a non-oxidative gas, e.g., inert gas, while it is being heated. However, the inventors of the present invention have found, that release of hydrogen from a compact is accelerated when the pressure inside the furnace is reduced to almost vacuum until temperature reaches a certain range.

The method of the present invention for producing a magnetostrictive element, developed based on the above finding, comprises the steps of compacting a starting alloy powder containing a hydride into a shape in a magnetic field to prepare a compact; heating the compact to a first temperature while the pressure in an atmosphere is reduced to a given pressure or lower; and supplying a given atmosphere after attaining the first temperature and elevating the temperature of the atmosphere to a second temperature to sinter the compact.

The starting alloy powder preferably has a composition represented by Formula (1) $RT_y$ (wherein, R represents one or more rare-earth metals, (a concept of rare-earth metals including Y), T is one or more transition metals and y is $1<y<4$). R is preferably Tb and Dy, and more preferably has a composition represented by Formula (2) $Tb_a Dy_{(1-a)}$ (wherein, $0.27<a \leq 0.50$).

It is preferable to select Fe as T, which may be partly substituted by Co and/or Ni.

When a compact of alloy powder containing hydride is sintered, the hydride present in the compact is thermally decomposed during the sintering step and hydrogen gas is released from the compact. Since the pressure inside the furnace is reduced to a given level or less, hydrogen gas released is not filled in the furnace and release of hydrogen from the compact is not prevented.

In the step of heating the compact to the first temperature while atmosphere pressure is reduced to a given pressure or less, it is preferable to make the atmosphere almost vacuum. The condition of almost vacuum means that pressure is $2 \times 10^{-5}$ Torr (1 Torr≈133.322 Pa) or less. It is also preferable to set the first temperature at 450 to 750° C., more preferably 550 to 750° C.

The hydride present in the compact is thermally decomposed at around 650° C. to release hydrogen gas. Therefore, release of hydrogen gas may not be accelerated when the first temperature, as the upper limit to keep atmosphere pressure at a given level or less, is below 450° C. At above 750° C., on the other hand, the density of the sintered body may be decreased.

The atmosphere to be supplied after temperature reaches the first level is preferably of a non-oxidative gas, e.g., inert gas. Supplying a hydrogen gas or a mixture of hydrogen gas and inert gas is also effective to improve density of the finally obtained sintered body. When hydrogen gas and inert gas are supplied together, it is preferable to mix them at 650° C. or higher during the heating step, to avoid oxidation by oxygen remaining in a very small quantity.

In the step carried out after the atmosphere is heated to the second temperature to sinter the compact, it is preferable to keep temperature almost constant, preferably at 1150 to 1230° C. At below 1150° C., the sintering step needs to be kept for a longer time to remove the internal strain and hence is not effective. At above 1230° C., on the other hand, the temperature is close to the melting point of the alloy represented by $RT_y$, to cause problems, e.g., melting of the sintered body or deposition of another phase, e.g., $RT_3$.

The present invention can be regarded as a method for sintering an object to be sintered which contains a hydride. The method comprises the steps of releasing hydrogen gas generated by thermal decomposition of the hydride present in the object from the object by placing the object in a furnace and elevating the temperature inside the furnace to a first temperature while keeping the pressure inside the furnace at negative pressure; and sintering a compact by supplying a given atmosphere in the furnace after the first temperature is attained and elevating the temperature inside the furnace to a second temperature.

Keeping the first temperature at a level at which thermal decomposition of the hydride starts or higher is effective for reducing a generation rate of the nests in the sintered body.

Moreover, temperature at which the given atmosphere is supplied into the furnace after the first temperature is attained, is preferably 650° C. or higher.

It is preferable to keep atmosphere temperature in the furnace within a given range for a given time in the step of sintering the compact. It is also preferable to supply a hydrogen gas or mixed hydrogen/inert gas atmosphere into the furnace.

Such object to be sintered is not limited to a material for magnetostrictive elements, so long as it contains a hydride. However, it can be a compact containing Tb, Dy and Fe and to be sintered into a magnetostrictive element.

DETAILED DESCRIPTION OF THE PREFERRED EMBODIMENTS

Figure 1:
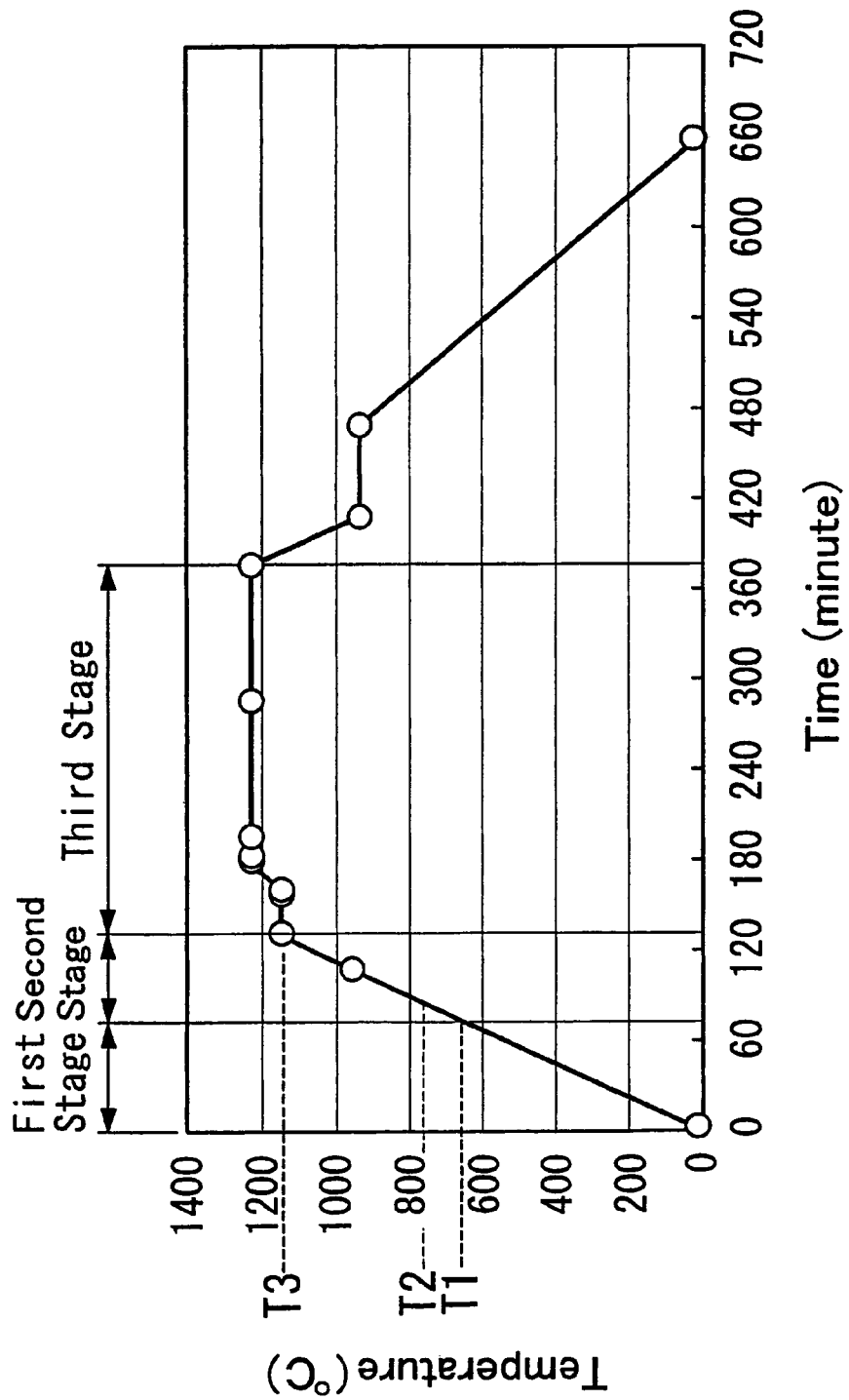
FIG. 1 shows a temperature profile adopted in one embodiment of the present invention, based on which a compact is sintered.

The present invention is described in detail, based on the preferred embodiments illustrated in the attached drawings.

First, the method for producing a magnetostrictive element of one embodiment is described.

In this embodiment, an alloy powder having a composition represented by Formula (1) $RT_y$ (wherein, R is one or more rare-earth metals, T is one or more transition metals and $1<y<4$) is sintered to prepare a magnetostrictive element.

R is at least one selected from rare-earth metals of lanthanoids and actinoids. Rare-earth metals represent a concept including Y. Of these metals, Nd, Pr, Sm, Tb, Dy and Ho as rare-earth elements are preferable, and Tb and Dy are more preferable and they may be used in combination. T represents at least selected from transition metals. The preferable transition metals as T include Fe, Co, Ni, Mn, Cr and Mo, and Fe, Co and Ni are more preferable. They may be used in combination.

An alloy is represented by the Formula (1) $RT_y$, wherein $1<y<4$. $RT_2$ ($RT_y$ with $y=2$) as a laves type intermetallic compound is suitable for a magnetostrictive element because of its high Curie temperature and high magnetostrictive value. When y is 1 or less, the RT phase is deposited in the alloy during heat treatment which follows sintering to decrease its magnetostrictive value. When y is 4 or more, the $RT_3$ or $RT_5$ phase increases also to decrease magnetostrictive value of the alloy. It is therefore preferable to keep the relationship $1<y<4$ to increase the $RT_2$ phase. R may be a mixture of rare-earth metals, in particular of Tb and Dy. In this case, in the alloy represented by Formula (2) $Tb_aDy_{(1-a)}$, it is preferable to satisfy the relationship $0.27<a\leq0.50$. The alloy of $(Tb_aDy_{(1-a)})T_y$ with satisfying the above relationship has a high saturation magnetostrictive coefficient and hence high magnetostrictive value. When a is 0.27 or less, the alloy may not have a sufficient magnetostrictive value at room temperature or lower. When it is above 0.50, on the other hand, the alloy may not have a sufficient magnetostrictive value at around room temperature. T is particularly preferably Fe, which forms an intermetallic compound ((Tb, Dy) $Fe_2$) with Tb or Dy to provide a sintered body having a high magnetostrictive value and other magnetostrictive characteristics. Fe may be partly substituted by Co or Ni. However, Co decreases permeability although increasing magnetic anisotropy, while Ni decreases Curie temperature to decrease magnetostrictive value at room temperature and in a high magnetic field. Therefore, Fe preferably accounts for 70% by weight or more of T, more preferably 80% by weight or more.

Moreover, the alloy powder is preferably treated to absorb hydrogen partly or totally. The alloy powder, when absorbs hydrogen, produces a strain in the particles that constitute the alloy powder, the resulting internal stress cracking the particles. The alloy powder to be mixed is cracked into fractions, when exposed to pressure during the compacting step, and the resulting compact can be sintered more densely. Rare-earth elements, e.g., Tb and Dy, are easily oxidated, and coated with an oxide film of high melting point in the presence of oxygen even in a trace quantity, to retard sintering. They are more resistance to oxidation, when absorb hydrogen. Therefore, the alloy powder can be sintered more densely, when its component is treated to absorb hydrogen.

The hydrogen-absorbing component of the starting material preferably has a composition represented by formula (3) $Dy_bT_{(1-b)}$ with b satisfying the relationship of $0.37\leq b\leq1.00$. T may be Fe by itself or Fe partly substituted by Co or Ni. This allows the starting alloy powder to be sintered more densely.

Preparation of the above-mentioned starting alloy powder is described more specifically.

First, Tb, Dy and Fe are weighed and then melted in an inert gas atmosphere of Ar to prepare the alloy (hereinafter referred to as Starting Material A) as one of starting materials. Starting Material A has a composition of $Tb_{0.4}Dy_{0.6}Fe_{1.94}$, for example. The Starting Materials A is annealed in order to make concentration distribution of the elements uniform and remove a dissimilar phase when it deposits, and is then milled by, e.g., an atomizer.

Then, $DyH_2$ and Fe are weighed and then melted in an inert gas atmosphere of Ar to prepare the alloy (hereinafter referred to as Starting Material B) as one of starting materials. The $DyH_2$/Fe ratio is set in such a way that Starting Material B has a composition of $Dy_{2.0}Fe$ after hydrogen is released during the sintering step. It is similarly milled by, e.g., an atomizer.

Further, Fe as one of starting materials, is reduced in a hydrogen gas atmosphere to remove oxygen, and is then milled by, e.g., an atomizer (hereinafter referred to as Starting Material C).

The reducing atmosphere containing hydrogen gas for the reduction treatment preferably has a hydrogen to argon (Ar) gas ratio of X:100-X (Formula (4)) with X as hydrogen gas content (% by volume) satisfying the relationship of $0<X<50$. An Ar gas is inert and does not oxidize R. Therefore, it can form a reducing atmosphere when mixed with hydrogen gas. Hydrogen gas content X (% by volume)

satisfies 0<X to make the atmosphere reductive, and X<50 because the reducing function is saturated at 50≦X.

Obtained Starting Materials A, B and C are weighed, milled and mixed with each other to prepare the starting alloy powder having a composition of $Tb_{0.3}Dy_{0.7}Fe_{1.88}$, for example.

In this embodiment, the starting alloy powder is compacted in a mold in a magnetic field of a given intensity, e.g., 8 kOe to prepare a compact, and the resulting compact is sintered in a furnace.

In the sintering step, temperature in the furnace is programmed to have a given profile, e.g., the one illustrated in FIG. 1. During the first stage, in which sintering is started, the furnace inside is kept at a given degree or more of vacuum, preferably $2 \times 10^{-5}$ Torr (1 Torr≈133.322 Pa), by evacuating with a vacuum pump.

The temperature in the furnace is elevated at a given rate, while the furnace inside is kept at a given degree of vacuum, to a given temperature. The upper limit temperature T1 (first temperature) to keep vacuum is preferably set at 450 to 750° C. The hydride present in the compact is thermally decomposed at around 650° C. to generate hydrogen gas. Therefore, release of hydrogen gas may not be accelerated when the upper limit temperature T1 is below 450° C. When it is above 750° C., on the other hand, the density of the sintered body may be decreased.

The upper limit temperature T1 is preferably set according to the size (cross-sectional area) of the compact to be sintered. As the cross-sectional area increases, release of hydrogen gas is accelerated naturally, and the upper limit temperature T1 is set at a higher level.

In the first stage, the temperature in the furnace is preferably elevated continuously at a given rate without being kept at a constant level. The heating rate is preferably set at 3 to 20° C./minute. At below 3° C./minute, productivity is low. At above 20° C./minute, on the other hand, the compacted starting material powder may not be heated uniformly in the furnace to cause problems, e.g., segregation or production of a dissimilar phase.

When the first stage of the sintering step is completed, i.e., when the temperature in the furnace is reached to a given upper limit, evacuation by a vacuum pump is stopped, and the second stage is started.

In the second stage, heating is continued while a hydrogen gas or mixed hydrogen/inert gas atmosphere is supplied. In the case of a compact of the alloy represented by $RT_y$, mixed hydrogen/inert gas atmosphere (given atmosphere) in the furnace is attained until temperature increases from the upper limit temperature T1 to a given temperature T2. The given temperature T2 is preferably set at least 650° C. or higher in the above mixed atmosphere. This is to prevent oxidation of the rare-earth metal(s) by a trace quantity of residual oxygen. When the mixed atmosphere is adopted, it preferably has a hydrogen to argon (Ar) gas ratio of X:100-X (Formula (4)) with X as hydrogen gas content (% by volume) satisfying the relationship of 0<X<50.

The atmosphere in the furnace is preferably heated at 3 to 20° C./minute also in the second stage. At below 3° C./minute, productivity will go down. At above 20° C./minute, on the other hand, the compacted starting material powder may not be heated uniformly in the furnace to cause problems, e.g., segregation or production of a dissimilar phase.

Heating in the second stage is stopped when the atmosphere in the furnace is heated to the given temperature (second temperature) T3, and the third stage is started.

In the third stage, the temperature in the furnace is kept at a constant level, preferably 1150 to 1230° C. At below 1150° C., the sintering step needs a longer time to remove the internal strain and hence is not effective. At above 1230° C., on the other hand, it is closed to the melting point of the alloy represented by $RT_y$, to cause problems, e.g., melting of the sintered body or deposition of another phase, e.g., $RT_3$.

The third stage of the sintering step is preferably carried out in a hydrogen gas atmosphere or a mixed hydrogen/inert gas atmosphere having a hydrogen to argon (Ar) gas ratio of X:1-X (Formula (5)) with X as hydrogen gas content satisfying the relationship of 0<X<0.5.

R readily reacts with oxygen to form a stable rare-earth oxide, which exhibits only a limited magnitude of magnetism, and cannot be a practical magnetic material with its insufficient magnetic properties. Oxygen, although present at a very low content, can greatly deteriorate magnetic properties of the sintered body prepared at high temperature. Therefore, the heat treatment, such as sintering, to prepare the sintered body is carried out particularly preferably in a hydrogen-containing atmosphere. An inert gas atmosphere can control oxidation, but when an inert gas alone is used, it is difficult to completely remove oxygen, allowing it to react with a rare-earth metal, which is highly reactive with oxygen, to form the oxide. Therefore, the sintering atmosphere is preferably of a hydrogen/inert gas mixture to prevent oxidation of the rare-earth metal(s).

Through the step comprising the first to third stages, the compact is sintered to obtain the sintered body. The sintered body is aging-treated and divided into fractions of given size, to produce the magnetostrictive element.

Figure 2:
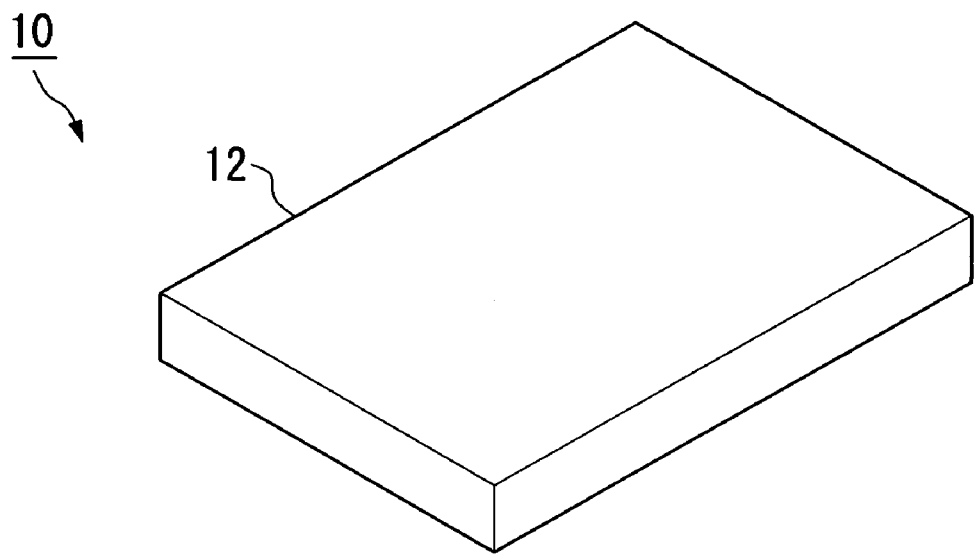
FIG. 2 is an oblique view of a sintering container structure used in the sintering step.
Figure 2:
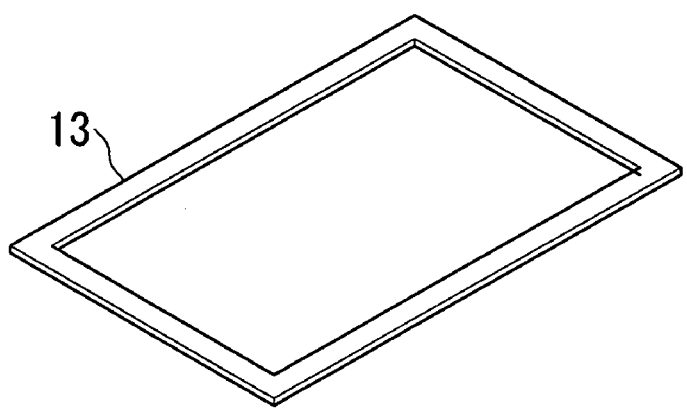
Figure 2:
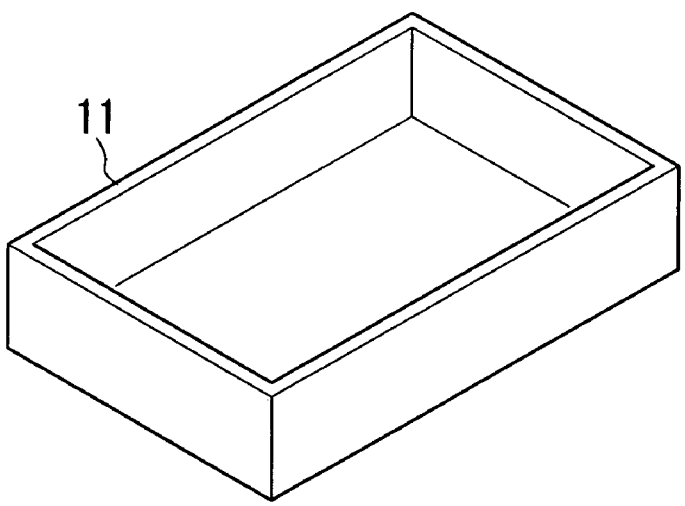
Figure 3:
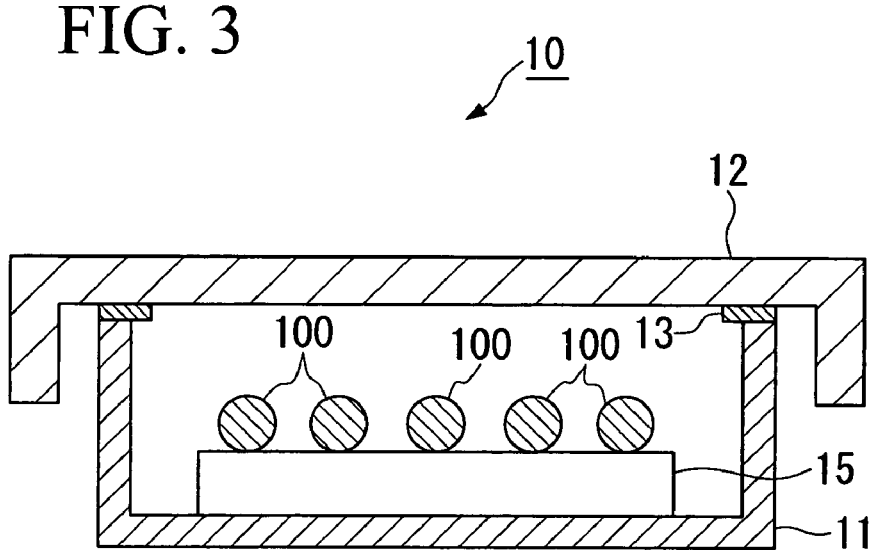
FIG. 3 is a cross-sectional view of a sintering container.

In the above sintering step, the compact (object to be sintered) 100, to be sintered into a magnetostrictive element, is sintered while being contained in a sintering container 10, as illustrated in FIGS. 2 and 3.

The sintering container 10 comprises the container body 11, lid 12 and sealing member 13, as illustrated in FIGS. 2 and 3.

The container body 11 and lid 12 are of a material highly resistant to heat and hardly reactive with a starting material component for a magnetostrictive element, e.g., molybdenum.

The sealing member 13 works to adhere the container body 11 and lid 12 to each other when the former is sealed by the latter, to provide a closed space in the sintering container 10. It is of a material highly resistant to heat and flexible, e.g., niobium.

The sintering container 10 constructed above-mentioned, is provided with the setter 15 in the container body 11. The compact 100 is set on the setter 15 while being sintered, after the container body 11 is closed by the lid 12.

The compact 100 held in the sintering container 10 is sintered at a given temperature in a furnace, in which temperature is programmed to have a given profile.

In this embodiment, a hydride present in the starting material for the compact 100 held in the sintering container 10 is thermally decomposed as it is heated to generate hydrogen gas, which is released into the sintering container 10. However, the pressure in the furnace, that is, the inside of the container 10 is kept at negative pressure by evacuating with a vacuum pump, in a temperature range in which hydrogen is released, with the result that release of hydrogen from the compact 100 is not prevented but rather accelerated. This ensures hydrogen to be completely released from the compact 100 before the solid-phase reaction starts on its surface. This, in turn, prevents formation of nests in the magnetostrictive element as the final product, controlling deterioration of its strength and magnetic properties while improving its yield.

Moreover, the atmosphere in the furnace is kept under almost vacuum during the first stage of the sintering step, to prevent oxidation of the compact 100.

EXAMPLE 1

Hydrogen generation rate during the first stage (heating stage) was measured under different conditions in the furnace, under almost vacuum and in an inert gas (Ar gas) atmosphere, to compare the effects of these conditions. The results are described below.

As for Starting Material A, Tb, Dy and Fe were weighed and then melted in an inert gas atmosphere of Ar to prepare the alloy having a composition $Tb_{0.4}Dy_{0.6}Fe_{1.94}$. It was annealed to secure an even concentration distribution of each metal element of the prepared alloy and remove a dissimilar phase when it deposits, and was then milled by an atomizer. Next, as for Starting Material B, $DyH_2$ and Fe were weighed at given ratio and were melted in an inert gas atmosphere of Ar, where the $DyH_2$/Fe ratio was set in such a way that Starting Material B had a composition of $Dy_{2.0}Fe$ after hydrogen was released during the sintering step. The resulting alloy having a composition of $Dy_{2.0}Fe$ was also milled in a similar manner by an atomizer. As for Starting Material C, Fe was reduction-treated in a hydrogen gas atmosphere to remove oxygen, and then milled by an atomizer.

Then, Starting Materials A, B and C were weighed, milled and mixed with each other to prepare the alloy powder having a composition of $Tb_{0.3}Dy_{0.7}Fe_{1.88}$.

The alloy powder was compacted in a mold in a magnetic field of 8 kOe, to prepare the compact 100. It had a stick shape, 7 mm in diameter and 100 mm in length. Quantity of hydrogen contained in the compact 100 was set at 2.03 g (22.74 NL (normal liter, volume at normal temperature)).

The obtained compact 100, put in a sintering container 10 (internal dimensions of 170 mm in width, 240 mm in length and 60 mm in height); was heated in a furnace at 8.5° C./min from 20 to 1000° C.

During the heating step, the pressure in the furnace was kept at almost vacuum of $2 \times 10^{-5}$ Torr (1 Torr≈0.133.322 Pa) in EXAMPLE 1, while inert with Ar gas in COMPARATIVE EXAMPLE, and hydrogen generation rate of each condition was measured.

Figure 4:
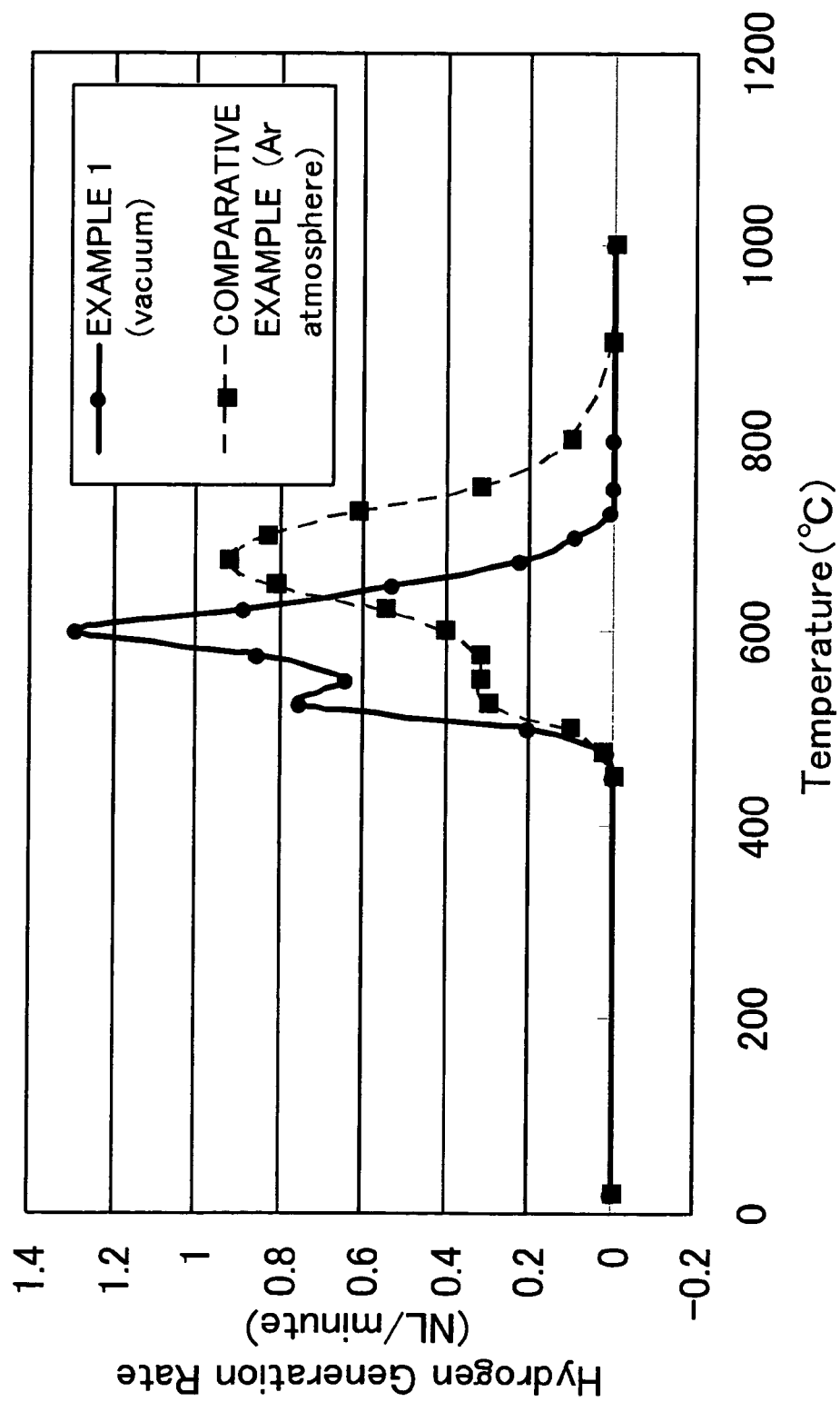
FIG. 4 compares quantity of hydrogen released from a compact sintered in different atmospheres, almost vacuum versus inert gas atmosphere.

The results are shown in FIG. 4.

As shown in FIG. 4, hydrogen was generated in a wide temperature range from 500 to 900° C. in COMPARATIVE EXAMPLE carried out in an Ar atmosphere. By contrast, it was generated more massively in a narrower range from 500 to 750° C., particularly notably at around 600° C., in EXAMPLE 1 carried out at almost vacuum.

EXAMPLE 2

Formation of nests in the magnetostrictive element sintered while it was held in the above-mentioned sintering container 10 was investigated. The results are described below.

First, 773 g of Starting Material A, $Tb_{0.4}Dy_{0.6}Fe_{1.94}$, 101 g of Starting Material B described below and 46 g of Starting Material C, Fe, were milled and mixed with each other to prepare the starting alloy powder having a composition of $Tb_{0.3}Dy_{0.7}Fe_{1.88}$. It was compacted in a mold in a magnetic field of 8 kOe, to prepare the compact 100. It had a stick shape, 7 mm in diameter and 100 mm in length. The $DyH_2$/Fe ratio was set for Starting Material B to have a composition of $Dy_{2.0}Fe$ after hydrogen was released, as in EXAMPLE 1.

The compact 100, put in the sintering container 10, was heated in a furnace following the temperature profile shown in FIG. 1.

The container body 11 of the sintering container 10 had internal dimensions of 170 mm in width, 240 mm in length and 60 mm in height.

In the first stage of the sintering step carried out following the temperature profile shown in FIG. 1, five levels of the upper limit temperature T1 to keep the given degree of vacuum or more, described below, were adopted.

Condition 1: T1=600° C.
Condition 2: T1=650° C.
Condition 3: T1=660° C.
Condition 4: T1=700° C.
Condition 5: T1=750° C.

The constant temperature in the third stage was set at 1230° C.

A total of 80 samples of the compact 100 were sintered under each of the conditions 1 to 5, and number of sintered bodies in which one or more nests were generated was counted.

Figure 5:
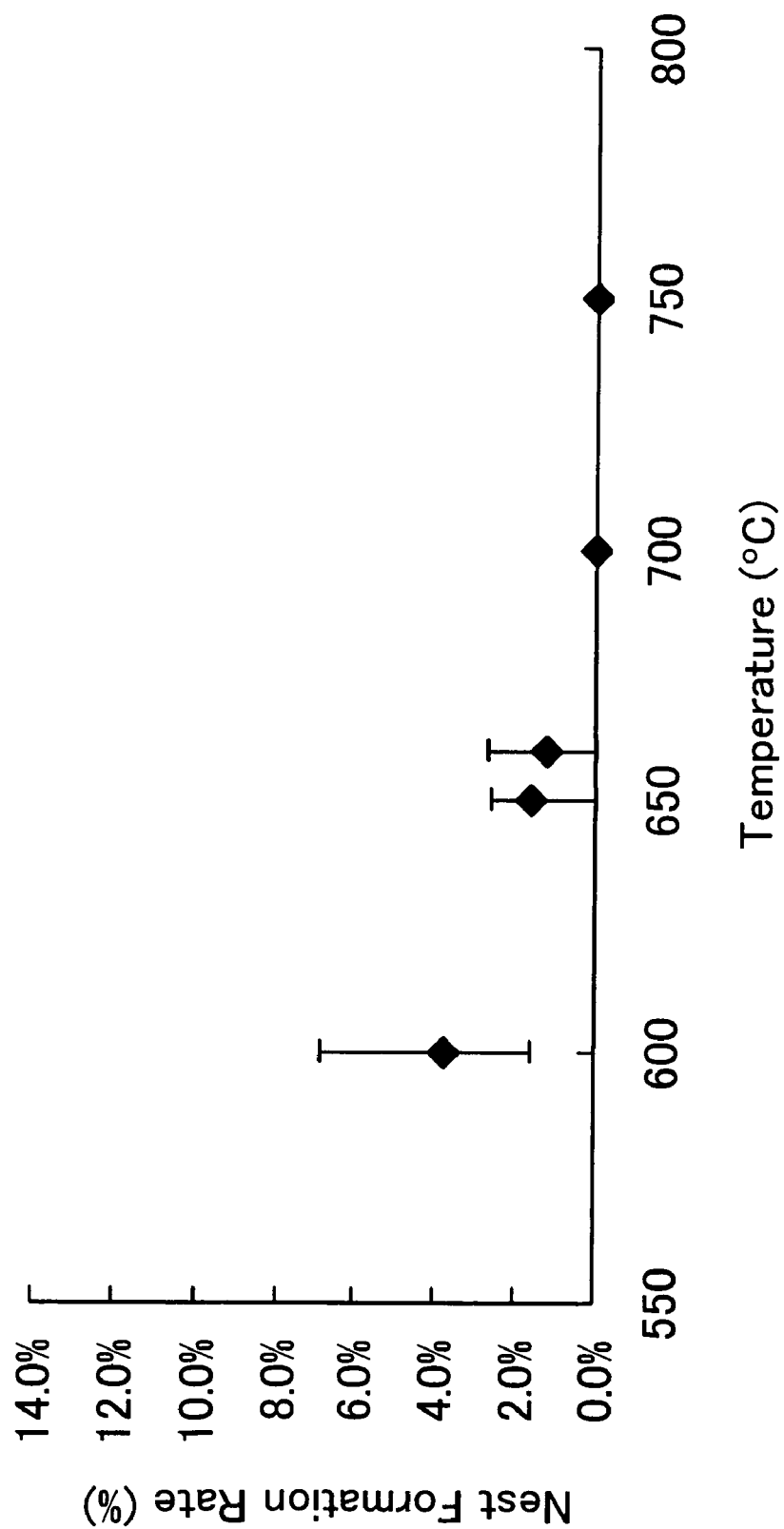
FIG. 5 shows the relationship between nest formation rate and upper limit temperature in the stage where sintering atmosphere is kept at almost vacuum.

The results are shown in FIG. 5.

As shown in FIG. 5, the nest formation rate, defined as number of sintered bodies in which one or more nests were generated divided by 80, was 4% under Condition 1 of T1=600° C., 1.5% under Condition 2 of T1=650° C., 1% under Condition 3 of T1=660° C., and 0% under Condition 4 of T1=700° C. and under Condition 5 of T1=750° C.

It is apparent that formation of nests can be decreased when the upper limit temperature T1, to which the compact is continuously heated while the atmosphere is kept at a given degree of vacuum or more, is set at around 650° C., at which decomposition of the hydride starts, or higher, more notably when it is set at around 700° C. or higher.

The sintering container 10 is not limited to the one used in the above embodiment so long as it is structured to hold the compact 100 during the sintering step, and the compact 100 can be taken in and from before and after the sintering step.

The structure described in the above embodiment can be modified or changed to another one without departing from the sprit and scope of the present invention.

As described above, the present invention can prevent formation of a nest in an object to be sintered finally obtained, such as a magnetostrictive element or others without restraining release of hydrogen from a compact during the sintering step by keeping the pressure in a furnace at a low level while temperature is continuously increased, and hence improve product yield.

What is claimed is:

1. A method for producing a magnetostrictive element comprising the steps of:
   compacting a starting alloy powder containing a hydride into a shape in a magnetic field to prepare a compact;
   heating said compact to a first temperature while the pressure in an atmosphere is reduced to a given pressure or lower; and
   supplying a given atmosphere after said first temperature is attained and elevating the temperature of said atmosphere to a second temperature to sinter said compact;
   wherein said first temperature is set at 450° C. or higher but below 750° C.; and wherein said atmosphere in the step of heating said compact to said first temperature is kept under almost vacuum.

2. The method for producing a magnetostrictive element according to claim 1, wherein:
said given atmosphere supplied after said first temperature is attained is a non-oxidative gas atmosphere.

3. The method for producing a magnetostrictive element according to claim 1, wherein:
said second temperature is 1150 to 1230° C., both inclusive.

4. The method for producing a magnetostrictive element according to claim 1, wherein:
said starting alloy powder has a composition represented by Formula (1) $RT_y$ (wherein, R is one or more rare-earth metals (wherein, the concept of said rare-earth metals includes Y), T is one or more transition metals and $1<y<4$).

5. The method for producing a magnetostrictive element according to claim 4, wherein:
R is Tb and Dy.

6. The method for producing a magnetostrictive element according to claim 5, wherein:
R has a composition represented by Formula (2) $Tb_a Dy_{(1-a)}$ (wherein, $0.27 < a \leq 0.50$).

7. The method for producing a magnetostrictive element according to claim 4, wherein:
T is Fe.

8. A method for sintering an object to be sintered which contains a hydride comprising the steps of:
releasing hydrogen gas generated by thermal decomposition of the hydride present in said object from said object, by placing said object in a furnace and elevating the temperature inside the furnace to a first temperature while keeping the pressure inside said furnace at negative pressure; and
sintering said object by supplying a given atmosphere in said furnace after said first temperature is attained and elevating the temperature inside said furnace to a second temperature.

9. The method for sintering according to claim 8, wherein:
said first temperature is a level at which thermal decomposition of said hydride starts or higher.

10. The method for sintering according to claim 8, wherein:
temperature at which the given atmosphere is supplied into said furnace after said first temperature is attained, is 650° C. or higher.

11. The method for sintering according to claim 8, wherein:
the temperature in said furnace is kept within a given range for a given time in the step of sintering said compact.

12. The method for sintering according to claim 8, wherein:
a hydrogen gas or mixed hydrogen/inert gas atmosphere is supplied in said furnace in the step of sintering said compact.

13. The method for sintering according to claim 8, wherein:
said object is a compact that contains Tb, Dy and Fe and is sintered into a magnetostrictive element.

* * * * *